(12) United States Patent
Shaw et al.

(10) Patent No.: US 9,716,485 B2
(45) Date of Patent: Jul. 25, 2017

(54) FREQUENCY DIVIDER APPARATUS

(71) Applicants: Board of Trustees of Michigan State University, East Lansing, MI (US); The Regents of the University of California, Oakland, CA (US)

(72) Inventors: Steven Shaw, Williamston, MI (US); Brian S. Strachan, Okemos, MI (US); Kimberly L. Turner, Santa Barbara, CA (US); Kamala Qalandar, Ojai, CA (US)

(73) Assignees: Board of Trustees of Michigan State University, East Lansing, MI (US); The Regents of the University of California, Oakland, CA (US)

( * ) Notice: Subject to any disclaimer, the term of this patent is extended or adjusted under 35 U.S.C. 154(b) by 61 days.

(21) Appl. No.: 14/732,211

(22) Filed: Jun. 5, 2015

(65) Prior Publication Data

US 2015/0357992 A1    Dec. 10, 2015

Related U.S. Application Data

(60) Provisional application No. 62/009,260, filed on Jun. 8, 2014.

(51) Int. Cl.
*H03B 19/12*    (2006.01)
*H03H 9/02*     (2006.01)
*H03H 9/50*     (2006.01)
*H03K 27/00*    (2006.01)

(52) U.S. Cl.
CPC ......... *H03H 9/02244* (2013.01); *H03B 19/12* (2013.01); *H03H 9/505* (2013.01); *H03K 27/00* (2013.01); *H03H 2009/02291* (2013.01)

(58) Field of Classification Search
CPC .... H03K 21/00; H03K 27/00; H03H 9/02244; H03B 19/00; H03B 19/12; H03B 19/14; H03B 2200/0016; H03B 5/32
USPC .................................................. 333/218, 187
See application file for complete search history.

(56) References Cited

U.S. PATENT DOCUMENTS

| | | | | |
|---|---|---|---|---|
| 4,245,355 | A  * | 1/1981 | Pascoe ................. | H03D 9/0608 455/326 |
| 4,327,343 | A  * | 4/1982 | Cornish ................. | H03B 19/14 327/118 |
| 6,262,464 | B1 * | 7/2001 | Chan .................... | H03H 3/0072 257/414 |
| 6,605,849 | B1   | 8/2003 | Lutwak et al. | |
| 8,542,074 | B2 * | 9/2013 | Nakamura ............... | H03B 5/30 331/116 M |

FOREIGN PATENT DOCUMENTS

WO    WO2015126498 A2 *  8/2015

* cited by examiner

*Primary Examiner* — Dean Takaoka
*Assistant Examiner* — Alan Wong
(74) *Attorney, Agent, or Firm* — Harness, Dickey & Pierce, PLC

(57) ABSTRACT

A frequency divider apparatus includes a micro-electromechanical system ("MEMS") divider that is configured to be driven by an input signal. The MEMS divider includes a passive mechanical device that generates multiple output signals. Each of the output signals has a frequency less than a frequency of the input signal.

32 Claims, 9 Drawing Sheets

FREQUENCY DIVIDER APPARATUS

CROSS-REFERENCE TO RELATED APPLICATIONS

This application claims the benefit of U.S. Provisional Application No. 62/009,260, filed on Jun. 8, 2014. The entire disclosure of the above application is incorporated herein by reference.

GOVERNMENT RIGHTS

This invention was made with government support under CMMI 1234067 and CMMI 1234645 awarded by the National Science Foundation. The government has certain rights in the invention.

BACKGROUND

The present disclosure relates to frequency dividers, and, more particularly, to a passive frequency divider.

Frequency conversion is the transfer of energy at one frequency to a different frequency. A frequency divider receives an input signal and generates an output signal that has a frequency which is less than a frequency of the input signal and is phase locked to the input signal. Frequency dividers are utilized in various devices and systems, such as sensors, radio frequency communication, frequency synthesis, etc.

Frequency dividers are commonly provided as solid state devices. Solid state devices are usually active systems in that such devices typically use an energy source other than the input signal. For example, solid state devices may require components, like amplifiers and buffers, which require additional power in order to operate. In addition to increasing the power consumption of the frequency divider, such solid state components may generate noise which affects the performance of the frequency divider. Frequency dividers have also been developed in other technologies, such as microstrip and optical cavities. Such dividers are large devices that are difficult to implement in low kHz to low GHz range due to large electromagnetic wavelength in these ranges.

In recent years, the demand for cascading frequency dividers which generate multiple signals at various frequencies has increased. Such dividers are becoming essential components for many operations. However, cascading solid state devices has raised new challenges with regard to power considerations and noise from impedance matching.

Unlike active frequency dividers, passive frequency dividers generally do not require additional power other than input signal. However, some passive dividers are larger in size than their active counterparts. Thus, a single device that performs as a passive system and operates as multiple cascading frequency dividers is needed in the industry.

SUMMARY

The present disclosure relates to a frequency divider apparatus that divides a frequency of an input signal. In another aspect, a frequency divider apparatus includes a micro-electro-mechanical system ("MEMS") divider that is configured to be driven by the input signal. A further aspect provides a MEMS divider which includes a passive mechanical device that generates multiple output signals in response to being driven by the input signal. A further aspect employs, a passive mechanical device including a plurality of microbeams that are connected to each other, such that the plurality of microbeams forms a chain of resonator modes in which the input signal energy is cascadingly transferred and whose frequency is cascadingly divided by each of the modes of the passive mechanical device.

The frequency divider apparatus of the present disclosure is advantageous over conventional devices. For example, the frequency divider apparatus is a passive system that uses MEMS resonators for cascadingly dividing an input signal. By having MEMS structure, the frequency divider apparatus has improved noise characteristics, low dissipation (high Q values), which allows for low power consumption, and can be easily integrated with electronic circuits. Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 a diagrammatic view of a communications system including a frequency divider apparatus according to the present disclosure;

Figure 5:
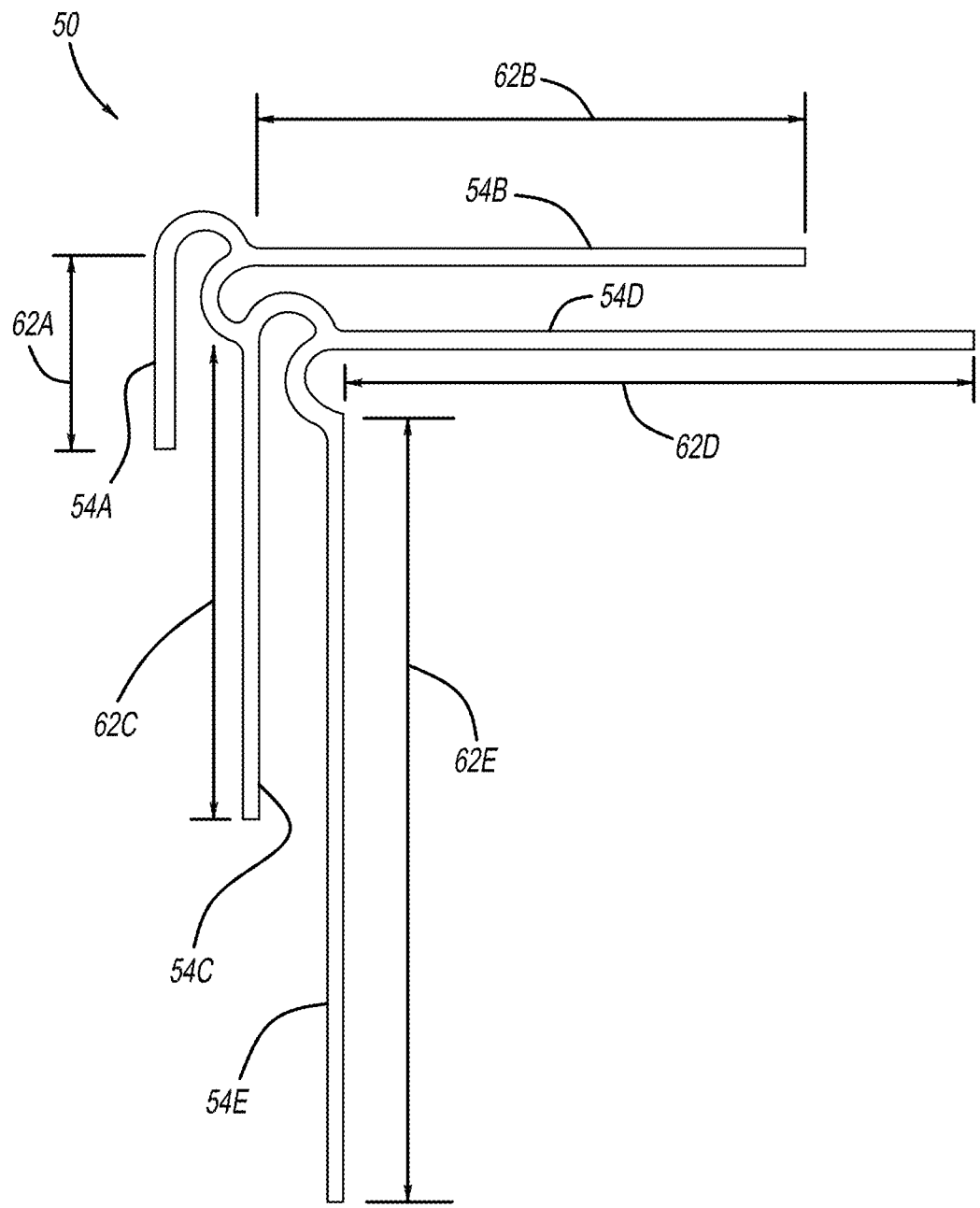
FIG. 5 is an enlarged elevational view showing a mechanical divider of the MEMS divider in a first embodiment.
Figure 9A:
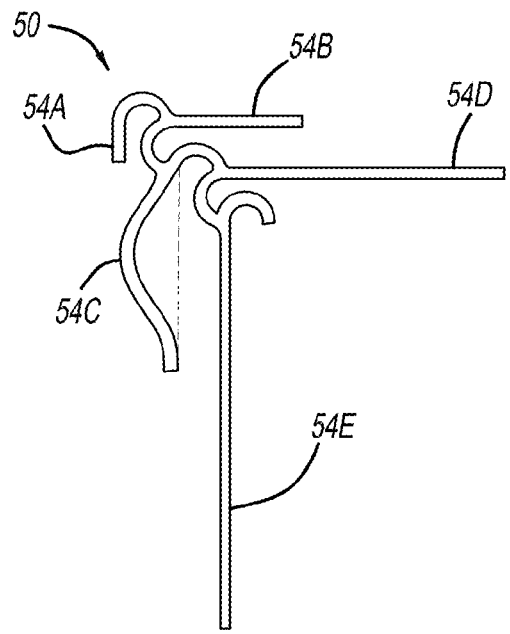
Figure 9B:
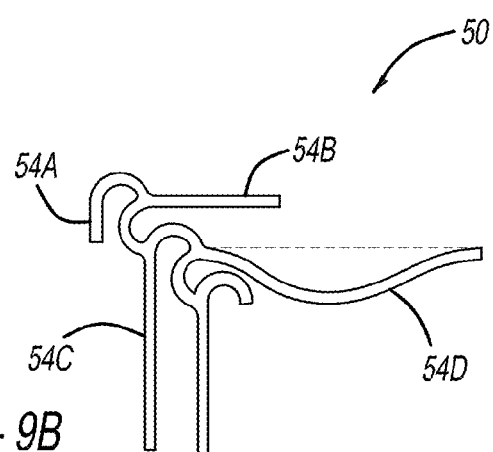
Figure 9C:
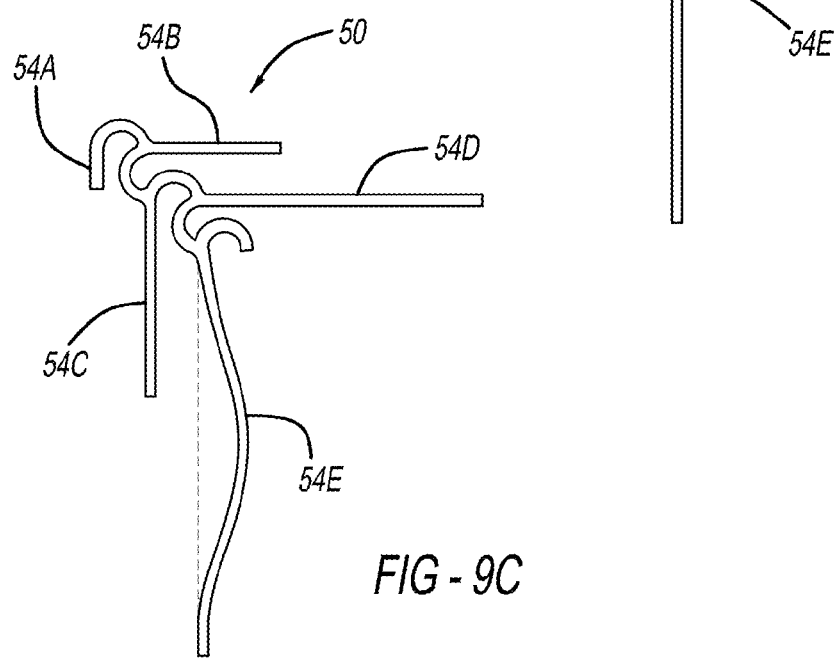
Figure 10:
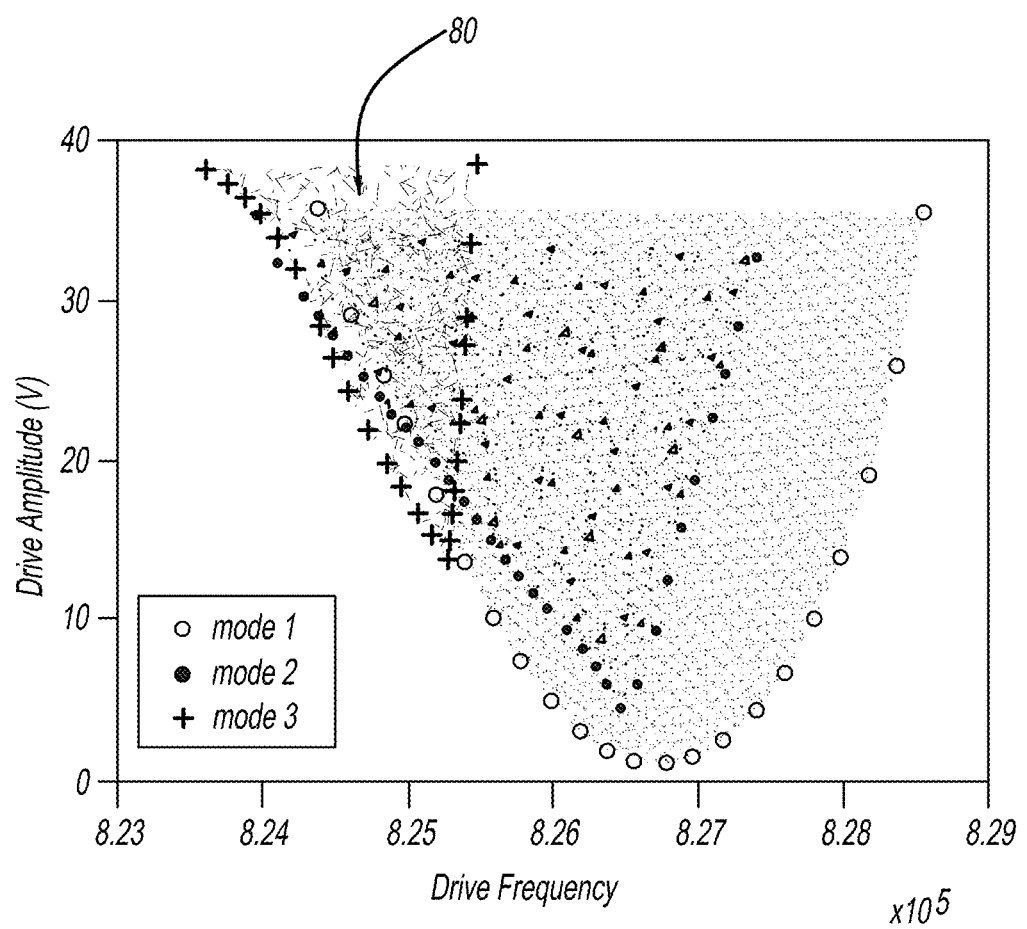
Figure 11:
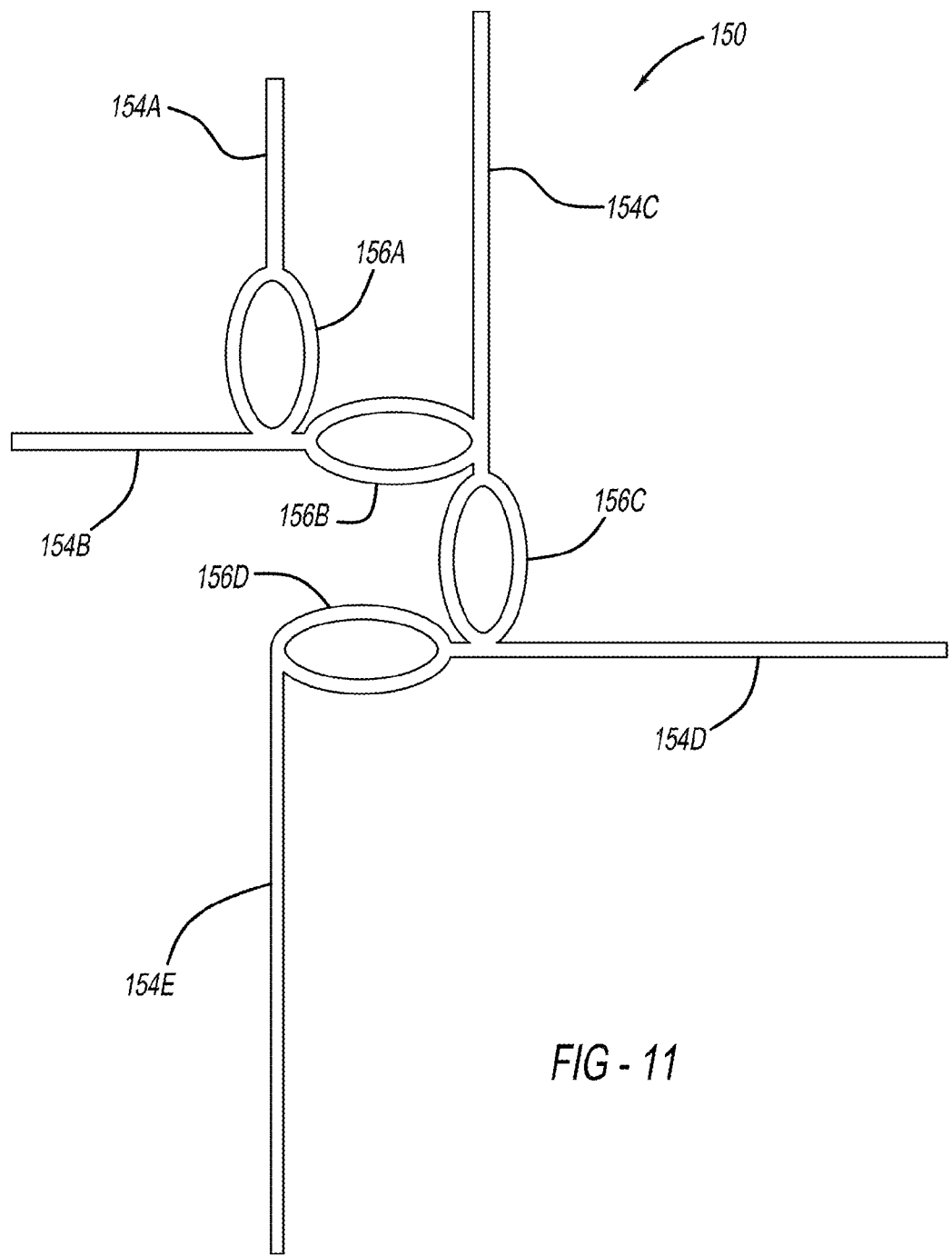
Figure 12:
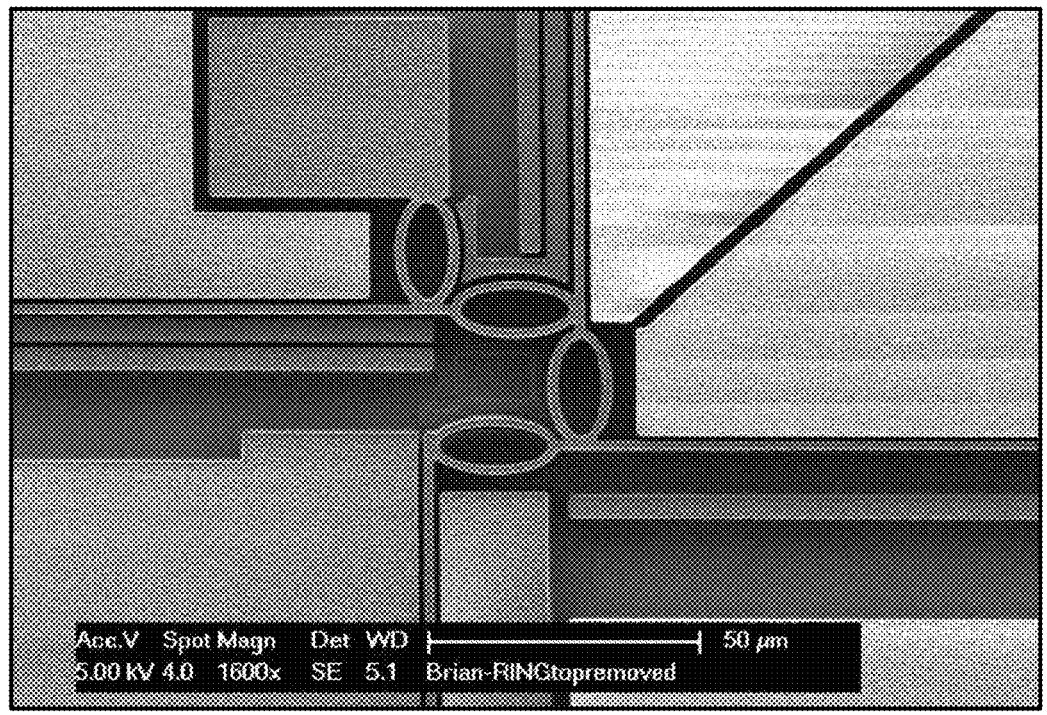
Figure 13:
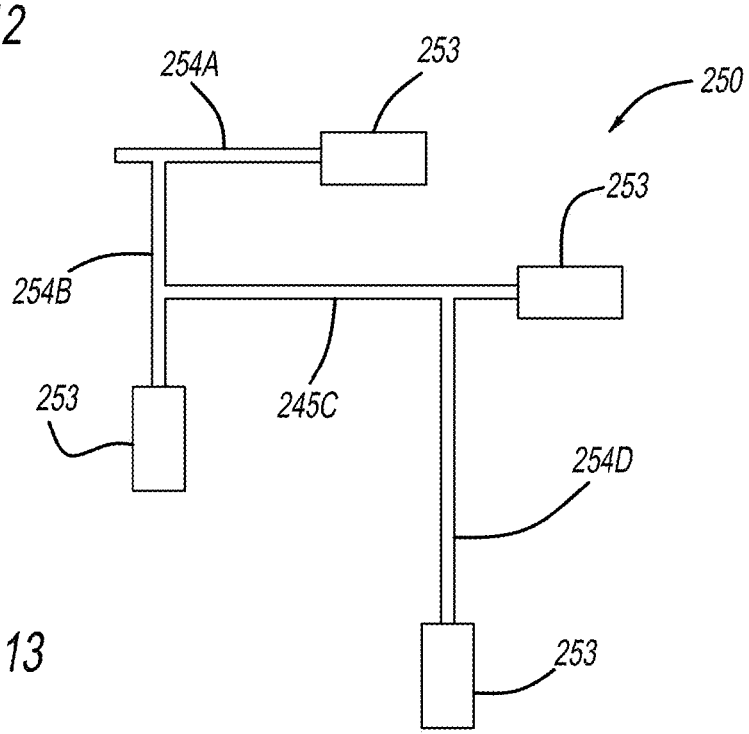
Figure 14:
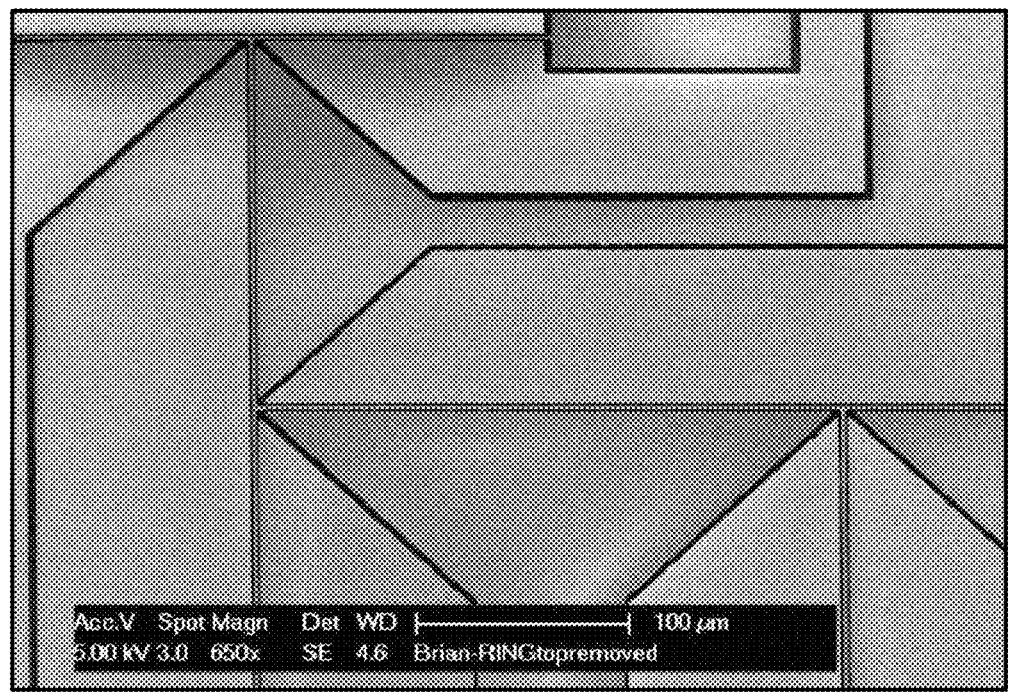

FIGS. 9A, 9B, and 9C are elevational views showing vibration modes of the mechanical divider of FIG. 5;

FIG. 10 is a graph showing Arnold tongues which represent the drive frequency and amplitude for exciting three modes of the mechanical divider of FIG. 5;

FIG. 11 is a elevational view showing a mechanical divider having ellipse shape coupling members in a second embodiment;

FIG. 12 is a SEM photograph showing MEMS divider having microbeams which are connected via the ellipse shape coupling members;

FIG. 13 is a elevational view showing a mechanical divider having microbeams arranged in a "T" shape configuration in a third embodiment; and FIG. 14 is a SEM photograph showing MEMS divider having microbeams arranged in the "T" shape configuration.

Corresponding reference numerals indicate corresponding parts throughout the several views of the drawings.

DETAILED DESCRIPTION

Figure 1:
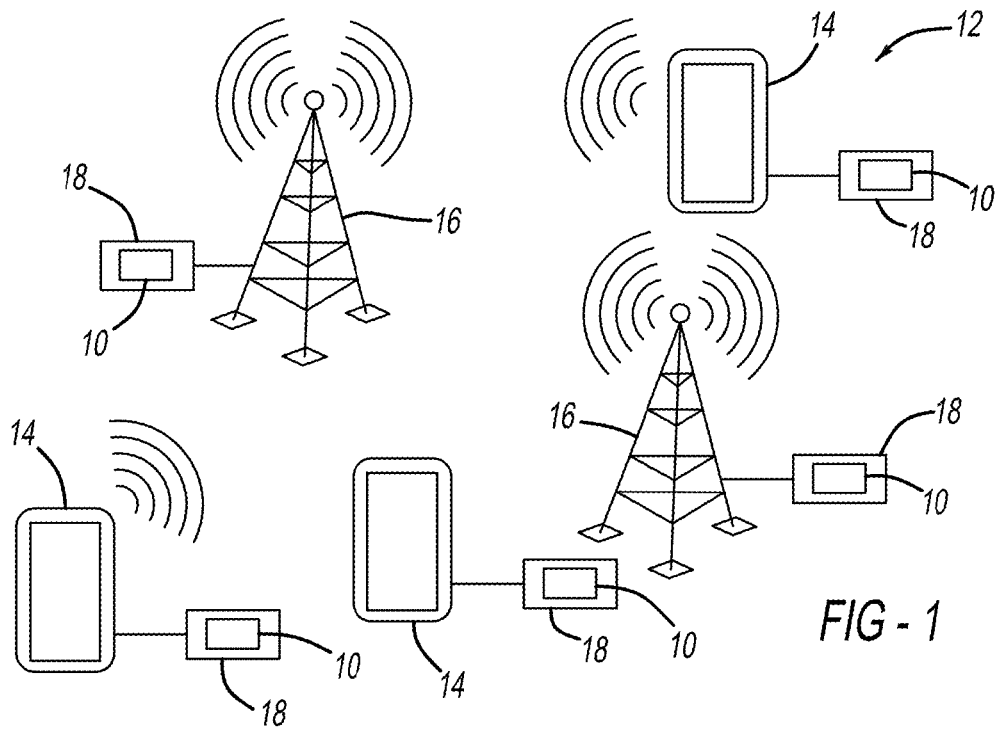

The present disclosure will now be described more fully with reference to the accompanying drawings. With reference to FIG. 1, an example of a communication system 12 in which a frequency divider apparatus 10 is utilized is presented. Communication system 12 includes multiple portable devices 14, such as smartphones, which are in communication with each other via one or more towers 16. Portable devices 14 and towers 16 include frequency divider apparatus 10 as part of a main control module 18. Frequency divider apparatus 10 generates low power signal which can be used by other electronic components as a clock reference signal. It is readily understood that frequency divider apparatus 10 may be used in other suitable systems, and is not limited to system 12.

Figure 2:
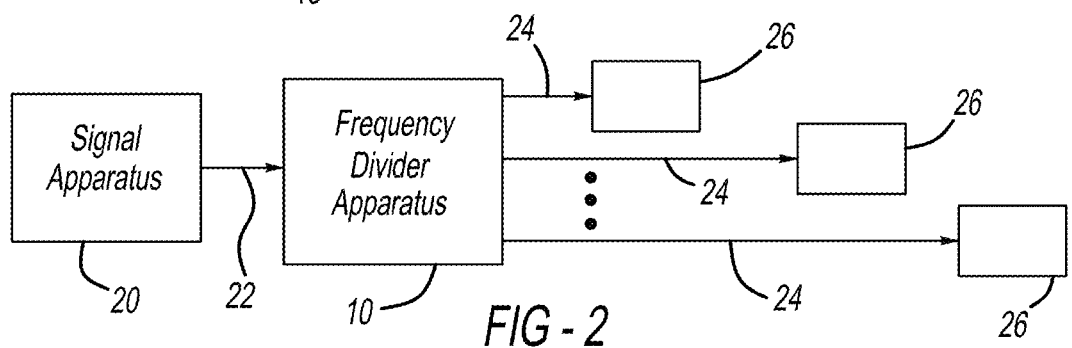
FIG. 2 is a block diagram showing an operation of the frequency divider apparatus.
Figure 3:
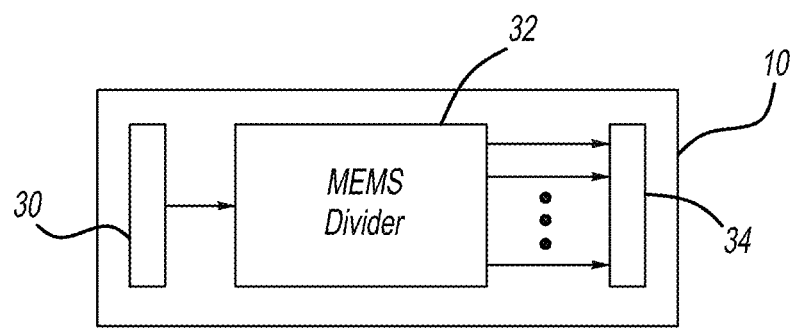
FIG. 3 is a block diagram of the frequency divider apparatus.

FIGS. 2-3 illustrate a functional block diagram of frequency divider apparatus 10. Frequency divider apparatus 10 is coupled to a signal generating apparatus 20 which drives frequency divider apparatus 10 via a drive input signal 22.

Input signal 22 has an initial drive frequency ($f_0$). Frequency divider apparatus 10 divides the initial drive frequency of input signal 22 to generate one or more phase locked signals 24 that have a frequency less than input signal 22. More particularly, frequency divider apparatus 10 is a passive mechanical divider whose operation is based on nonlinear coupling of the modes of the divider. Accordingly, frequency divider apparatus 10 generates signals 24 at various frequencies which are less than the initial drive frequency. Signals 24 may be supplied to one or more electronic components 26, such as a multiplexer, a radio frequency modulator, and/or other suitable components. While signal generating apparatus 20 may be a separate device in the example embodiment, it may also be integrated with frequency divider apparatus 10.

Frequency divider apparatus 10 includes an input terminal 30, a micro-electro-mechanical system ("MEMS") divider 32, and an output terminal 34. Input terminal 30 is coupled to signal generating apparatus 20 and applies the drive input signal 22 to MEMS divider 32. MEMS divider 32 divides input signal 22 into multiple signals having varying phase locked frequencies divided by integer multiples, which are outputted by output terminal 34 as signals 24.

FIGS. 4-7 illustrate MEMS divider 32. MEMS divider 32 includes a mechanical divider 50 which is formed on a substrate 52. Mechanical divider 50 is fixed to substrate 52 via one or more anchors 53. Substrate 52 is a silicon-insulator-silicon substrate. MEMS divider 32 is a single crystal silicon structure and can be fabricated using various suitable MEMS fabrication processes, such as deep reactive-ion etching.

Mechanical divider 50 includes a plurality of microbeams 54A, 54B, 54C, 54D, and 54E, which are collectively referenced by reference number 54. Microbeams 54 are arranged in a cascade forming a chain of resonator modes. Oscillation of a given microbeam 54 refers to a vibration mode in which the oscillation of the given beam is significantly larger than that of the remainder of mechanical divider 50. More particularly, a given vibration mode is distributed to all of the microbeams 54, but is concentrated in the given microbeam 54. Thus, nonlinear coupling occurs between the modes whose energy is concentrated in the given microbeam 54. It is readily understood that mechanical divider 50 may include more than one microbeam, and is not limited to five microbeams, as depicted in the figures.

Figure 4:
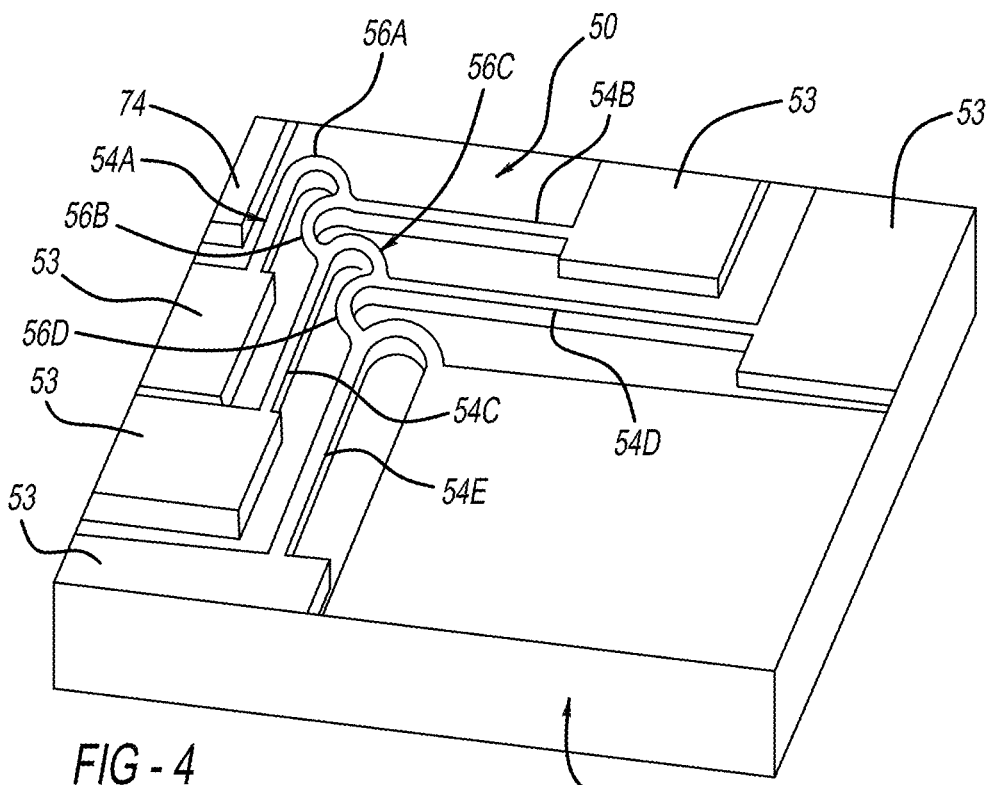
FIG. 4 is a perspective view of a micro-electro-mechanical system ("MEMS") divider of the frequency divider apparatus.
Figure 6:
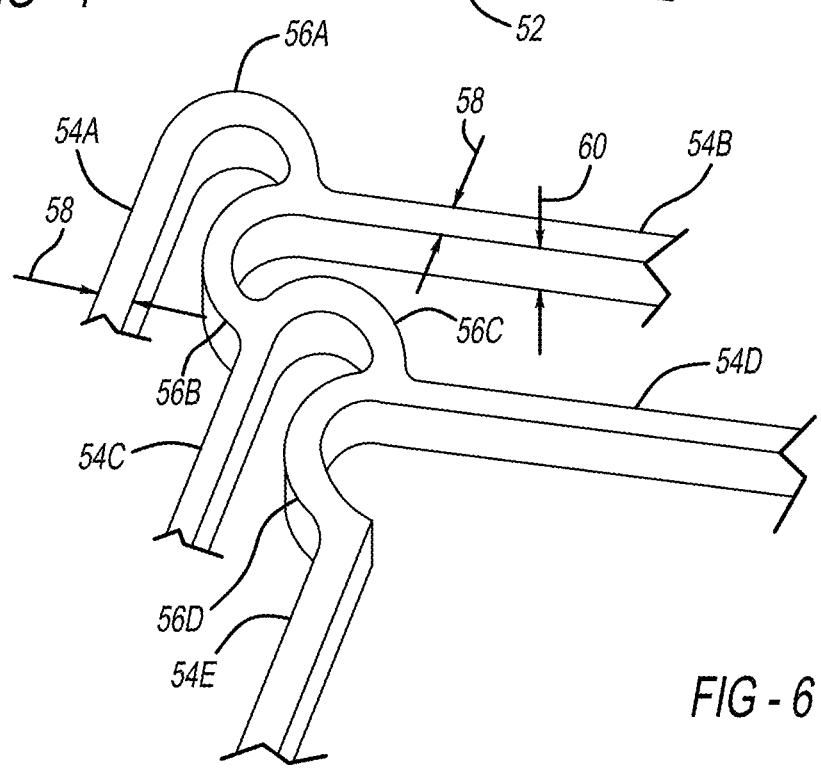
FIG. 6 is a partially enlarged view showing the mechanical divider of FIG. 4.

In the example embodiment, multiple coupling member 56A, 56B, 56C, 56D, and 56E, which are collectively referenced by reference number 56, connect two microbeams 54. For example, as shown in FIGS. 4 and 6, coupling member 56A connects microbeam 54A and microbeam 54B. Coupling member 56B connects microbeam 54B and microbeam 54C. Coupling member 56C connects microbeam 54C and microbeam 54D. Coupling member 56D connects microbeam 54D and microbeam 54E. Accordingly, mechanical divider 50 is provided as a single continuous structure. Coupling members 56 have a hook-like or a semi-circular shape.

Figure 7:
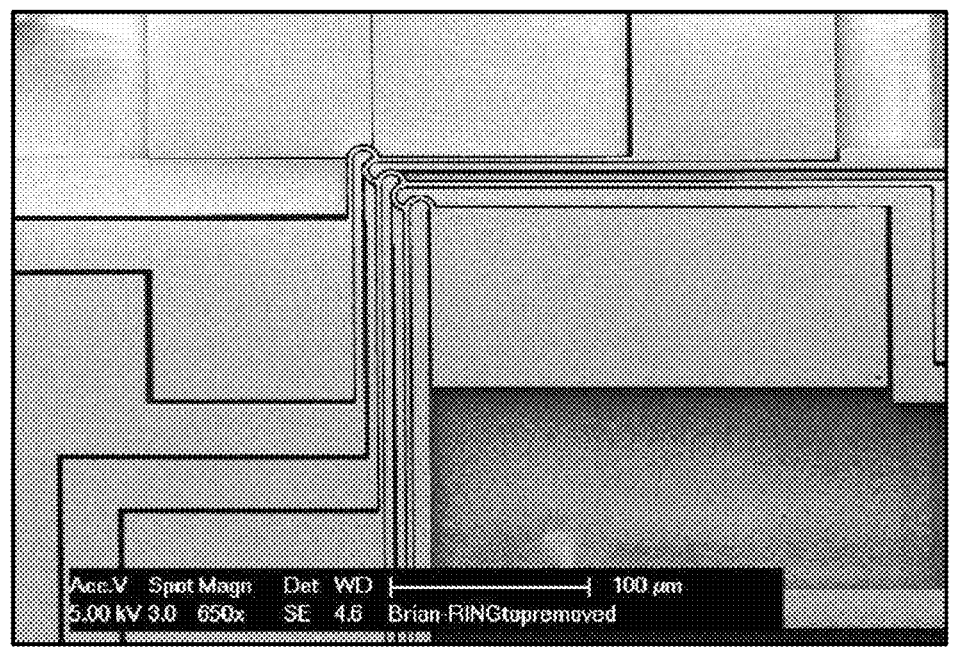
FIG. 7 is a scanning electron microscope ("SEM") photograph of the present MEMS divider having microbeams which are connected via a hook-like coupling member.

Each of microbeams 54 is coupled to substrate 52 via anchor 53. More particularly, microbeam 54 extends from anchor 53 and connects to an adjacent microbeam 54 via coupling member 56. Accordingly, microbeam 54 is connected to anchor 53 at one end and coupling member 56 at the other end. FIG. 7 is a scanning electron microscope ("SEM") photogram of MEMS divider 32 having microbeams which are coupled via hook-like coupling member.

In the example embodiment, microbeams 54 are orthogonally arranged with each other. More particularly, coupling member 56 connects two of microbeams 54 such that they are perpendicular to each other. Such arrangement allows for maximum transfer of a pulse to generate a transverse oscillation of microbeam 54. While microbeams 54 are arranged orthogonally, microbeams 54 may be arranged at other angles. However, in order to have a transverse oscillation of microbeam 54 based on nonlinear modal coupling, a parallel arrangement of microbeams 54 is avoided.

The following discussion focuses on the features of microbeams 54. For purposes of clarity, features related to a given microbeam from among the plurality of microbeams 54 may be generally referenced with "N" (N is an integer). Furthermore, with regard to the example embodiment, individual characteristics of microbeams 54A, 54B, 54C, 54D and 54E may be identified by A, B, C, D and E, respectively. For example, a length of given microbeam or a length of microbeam 54B may be identified as $L_N$ and $L_B$, respectively.

With continuing reference to FIGS. 5 and 6, microbeams 54 have a width 58, a depth 60, and a length (L) 62A, 62B, 62C, 62D, 62E (collectively referenced as length(s) 62). Microbeams 54 have approximately the same size width 58 and depth 60. Lengths 62 of microbeams 54 varies, such that lengths 62 increase by approximately a factor of square root of two ($\sqrt{2}$) when moving along the cascade. For example, a length $L_N$ of the $N^{th}$ beam 54 from the plurality of microbeams 54 may be approximated by Equation 1, where $f_N$ is the fundamental frequency of the given microbeam, $A_N$ is a coefficient regarding the boundary conditions of the given microbeam, E is the Youngs modulus along a primary axis of bending of the given microbeam, p is the density of the given microbeam, $W_N$ is width 58 of the given microbeam, and $L_N$ is the length 62 of the given microbeam.

$$f_N = A_N \left(\frac{W_N}{L_N^2}\right) \sqrt{\frac{E}{\rho}} \qquad \text{Equation 1}$$

Microbeams 54A, 54B, 54C, 54D, and 54E have lengths 62A, 62B, 62C, 62D, and 62E, respectively. Length 62A ($L_A$) of microbeam 54A has the smallest length among the five microbeams 54 and length 62E of microbeam 54E ($L_E$) has the longest length among the five microbeams 54. More particularly, the lengths 62A, 62B, 62C, 62D, and 62E of the microbeams 54A, 54B, 54C, 54D, and 54E have the following relationship: $L_A < L_B < L_C < L_D < L_E$.

Microbeams 54 of mechanical divider 50 are flexible beams performing as a series of self-similar resonator modes coupled in such a way so energy can cascade through the modes via subharmonic resonance. More particularly, the given microbeam oscillates in response to the oscillation of microbeam 54 positioned before the given microbeam (i.e., a former microbeam). Furthermore, microbeam 54 positioned after the given microbeam (i.e., a subsequent microbeam) oscillates in response to the oscillation of the given microbeam.

The oscillation of the given microbeam represents a vibration mode of the mechanical divider 50 which is localized at the given microbeam. Accordingly, a vibration mode which is localized in the given microbeam drives a vibration mode which is localized in subsequent microbeam. For example, with reference to FIG. 5, the vibration mode of microbeam 54C is driven by the vibration mode of microbeam 54B (the former microbeam) and the vibration mode of microbeam 54C drives the vibration mode of microbeam 54D (the subsequent microbeam). Thus, a signal applied to one of microbeams 54 cascades down through the chain of resonator modes, where each resonator subharmonically excites the next resonator. When the given microbeam is provided as driving the other microbeam, it is the vibration mode of the given microbeam that drives the vibration mode of the other microbeam.

The given microbeam has a natural frequency ($\omega_{ON}$). A parametric resonance occurs when the given microbeam is periodically driven with a drive frequency ($\Omega$) which is approximately equal to twice the natural frequency of the given microbeam (i.e., $\Omega \approx 2*\omega_{ON}$). The given microbeam then oscillates at $\Omega/2$ when excited by the drive frequency ($\Omega$).

To parametrically drive each of the microbeams 54 of mechanical divider 50, an internal resonance condition must be met. Specifically, the natural frequency of the former microbeam ($\omega_{O(N-1)}$) over the natural frequency of the given microbeam is approximately equal to two (i.e., $\omega_{O(N-1)}/\omega_{ON} \approx 2$). For example, in the example embodiment, in order for microbeam 54A to parametrically drive microbeam 54B, the natural frequency of microbeam 54A ($\omega_{OA}$) should be approximately equal to twice the natural frequency of microbeam 54B ($\omega_{OB}$; $\omega_{OA} \approx 2*\omega_{OB}$). Accordingly, the natural frequencies of microbeams 54A, 54B, 54C, 54D, and 54E have the following relationship: $\omega_{OA} > \omega_{OB} > \omega_{OC} > \omega_{OD} > \omega_{OE}$, where ($\omega_{OA} \omega_{OB}) \approx (\omega_{OB}/\omega_{OC}) \approx (\omega_{OC}/\omega_{OD}) \approx (\omega_{OD}/\omega_{OE}) \approx 2$. Such correlation allows the vibration mode at the given microbeam to drive the vibration mode at the subsequent microbeam.

Figure 8:
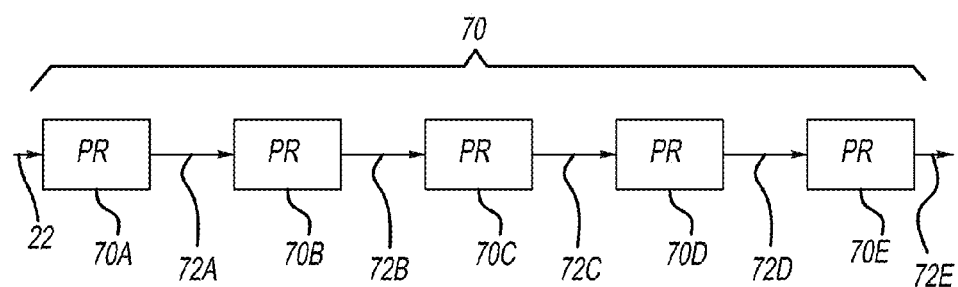
FIG. 8 is a block diagram of the mechanical divider.

FIG. 8 illustrates a functional block diagram of mechanical divider 50. The plurality of microbeams 54 perform as a plurality of passive resonators ("PR") 70. Accordingly, in the example embodiment, the five microbeams 54A, 54B, 54C, 54D, and 54E are provided as five resonators 70A, 70B, 70C, 70D, and 70E. The resonators 70A, 70B, 70C, 70D, and 70E output signals 72A, 72B, 72C, 72D, and 72E, respectively, which can be outputted as signals 24 by frequency divider apparatus 10. Signals 72 represent the vibration modes localized at the resonators.

Each of the resonators 70 is parametrically driven. For example, resonator 70A receives input signal 22, and outputs a signal 72A. Signal 72A has a frequency ($f_A$), which is half of the initial drive frequency ($f_0$, $f_A \approx f_0/2$). Signal 72A parametrically drives resonator 70B, such that a signal 72B outputted by resonator 70B has a frequency ($f_B$) which is half of the frequency of signal 72A. Similarly, resonators 70C, 70D, and 70E are parametrically driven to output the signals 72C, 72D, and 72E, which have frequencies ($f_C$, $f_C$, $f_E$) which are half of the frequencies of drive signals 72B, 72C, and 72D, respectively.

In FIG. 8, resonator 70A (i.e., microbeam 54A) receives the initial drive frequency for parametrically driving mechanical divider 50. Resonator 70A can be identified as a primary resonator (i.e., a primary microbeam) which initiates the parametric drive of the mechanical divider 50. Alternatively, one of the other microbeams 54 may be provided as the primary microbeam. For example, microbeam 54C may be the primary microbeam, thereby being parametrically driven by the initial drive frequency and initiating the parametric drive of subsequent microbeams 54D, 54E.

In operation, frequency divider apparatus 10 receives drive input signal 22 from signal generating apparatus 20. For example, signal generating apparatus 20 may be a voltage source which applies a drive voltage signal ($V_{dc}$) to frequency divider apparatus 10. More particularly, with substrate 52 grounded, when microbeam 54A is the primary microbeam, the drive voltage signal may be applied to a section of the MEMS divider 32 that is adjacent to microbeam 54A (e.g., a section 74 in FIG. 4). Section 74 is coupled to input terminal 30 of frequency divider apparatus 10. Alternatively, section 74 may receive the drive voltage signal directly from signal generating apparatus 20. Accordingly, the frequency divider apparatus 10 is driven capacitively by the voltage source via section 74. In the example embodiment, the primary microbeam is driven via section 74. Alternatively, the primary microbeam may be driven directly by applying drive input signal 22 directly to the primary microbeam, where the initial drive frequency is equal to the natural frequency of the primary microbeam.

Drive input signal 22 parametrically drives mechanical divider 50, such that a given microbeam 54 oscillates at a frequency equal to half the frequency of its drive signal. In other words, mechanical divider 50 vibrates such that the vibration modes localized at the microbeams 54 has a frequency near a modal natural frequency. For example, with reference to FIGS. 9A-9C, with microbeam 54C provided as the primary microbeam, microbeam 54C oscillates near a frequency equal to half the frequency of a drive signal applied to the microbeam 54C (FIG. 9A). Microbeam 54C parametrically drives microbeam 54D, which oscillates at a frequency that is half the oscillation frequency of the microbeam 54C (FIG. 9B). Microbeam 54D parametrically drives microbeam 54E, which oscillates at a frequency that is half the oscillation frequency of the microbeam 54D (FIG. 9C). While FIGS. 9A-9C depict a given microbeam as oscillating while the remaining microbeams 54 are not, the remaining microbeams 54 are also oscillating but the given microbeam has a higher amplitude than the other microbeams. More particularly, each mode shown in FIGS. 9A-9C is distributed to each of the microbeams but is concentrated at the given microbeam.

FIGS. 9A-9C depict the vibration modes of microbeams 54C, 54D, and 54E, and may be referred to as a first mode, a second mode, and a third mode, respectively. The strength of the drive input signal 22 can be determined based on parametric resonance zones for the first mode, the second mode, and the third mode. For example, FIG. 10 is a graph showing Arnold tongues for the first mode (mode 1), the second mode (mode 2), and the third mode (mode 3). The x-axis is the drive frequency and the y-axis is the drive amplitude of the drive signal. The shaded region provides an operation zone at which the modes are achieved. In other words, the shaded region provides the operation zone of the drive signal in which microbeams 54C, 54D, and 54E are excited. A portion of the shaded regions at which all three modes overlap (i.e., overlap region 80) represents the operation zone at which all three microbeams 54C, 54D, and 54E are parametrically driven. Thus, the necessary amplitude and drive frequency of the drive input signal 22 can be determined based on the excitation requirements for each of the modes.

FIGS. 11-14 illustrate alternative configurations of a mechanical divider. In the example embodiment, microbeams 54 are coupled via coupling member 56, which is provided as a semi-circular shape. Coupling member 56 may have other suitable shapes. For example, FIGS. 11 and 12 illustrate a mechanical divider 150 having ellipse shaped coupling members.

Mechanical divider 150 includes a plurality of microbeams 154A, 154B, 154C, and 154D, which are collectively referenced by reference number 154. Microbeams 154 are arranged in a cascade forming a chain of resonator modes. A plurality of coupling member 156A, 156B, 156C, 156D, and 156E, which are collectively referenced by reference number 156, connect two microbeams 154. Coupling members 156 have an ellipse-like shape. FIG. 12 is a partial SEM photograph of a MEMS divider having microbeams which are coupled via the coupling members 156.

In another variation, the microbeams may be directly coupled to one another. For example, FIGS. 13 and 14 illustrate a mechanical divider 250. Mechanical divider 250 includes a plurality of microbeams 254A, 254B, 254C, and 254D, which are collectively referenced by reference number 254. Microbeams 254 are arranged in a cascade forming a chain of resonator modes.

In lieu of a coupling member, microbeams 254 are directly coupled to each other. More particularly, the given microbeam is coupled to the former microbeam, such that the given microbeam extends and connects to a portion of the former microbeam if applicable. For example, each of the microbeams 254 is fixed to an anchor 253 at one end. Microbeam 254B extends and connects to microbeam 254A. Microbeam 254C extends and connects to microbeam 254B. Microbeam 254D extends and connects to microbeam 254C. Such configuration may be referenced as a "T" shape arrangement of microbeams 254. FIG. 14 is a partial SEM photograph of a MEMS divider having "T" shape arrangement of the microbeams.

Frequency divider apparatus 10 of the present disclosure is a passive multistep frequency divider based on parametric resonant properties. More particularly, mechanical divider 50 of MEMS divider 32 is provided as a subharmonic resonance cascade. The subharmonic resonance cascade has a chain of internally resonant subsystems arranged to allow energy exchange between the resonant subsystems.

Frequency divider apparatus 10 utilizes a cascade of N number of resonant subsystems (i.e., microbeams) to achieve division of the initial drive frequency by $2^N$. For example, if three resonator modes are utilized, frequency divider apparatus 10 divides the initial drive frequency by 2, 4 and 8.

Furthermore, frequency divider apparatus 10 is a passive system that is based on nonlinear dynamics of MEMS resonators. By having the MEMS divider 32, frequency divider apparatus 10 is able to utilize advantages related to MEMS, such as favorable noise characteristics and low dissipation (high Q values), which allows for low power consumption. MEMS are highly tunable in terms of frequencies, are easy to fabricate, and can be easily integrated with electronic circuits on a common substrate.

The foregoing description of the embodiments has been provided for purposes of illustration and description. It is not intended to be exhaustive or to limit the disclosure. For example, a transducer, an oscillator, or other suitable device can replace the voltage source as the signal generating device. Furthermore, MEMS divider can be directly connected to electronic components instead of being coupled via the output terminal. Additionally, MEMS divider may be made of other suitable material, such as polycrystalline, and is not limited to single crystal silicon. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A frequency divider apparatus for dividing a frequency of an input signal, the frequency divider apparatus comprising:
a mechanical divider configured to receive the input signal and including a plurality of microbeams cascadingly arranged, wherein two adjacent microbeams from among the plurality of microbeams extend along different axes, each of the plurality of microbeams is parametrically driven and each of the plurality of microbeams generates an output signal that has a frequency less than a frequency of the input signal.

2. The frequency divider apparatus of claim 1, further comprising:
a plurality of anchors fixedly connected to the plurality of microbeams; and
at least one coupling member, the coupling member connecting two adjacent microbeams from the plurality of microbeams, the coupling member coupling a first section of a given microbeam to a neighboring microbeam that is adjacent to the given microbeam, and the anchor being connected to a second section opposite of the first section of the given microbeam.

3. The frequency divider apparatus of claim 2, wherein the coupling member has a semi-circular shape.

4. The frequency divider apparatus of claim 2, wherein the coupling member has an elliptical shape.

5. The frequency divider apparatus of claim 1, wherein a plurality of microbeams are arranged in a cascading chain based on a length of the plurality of microbeams, such that the lengths of the microbeams increase along the cascading chain.

6. The frequency divider apparatus of claim 5, wherein the length of each of the plurality of beams increase by a factor approximately equal to square root of two.

7. The frequency divider apparatus of claim 1, wherein a frequency for driving a given microbeam from the plurality of microbeams is approximately twice a natural frequency of the given microbeam.

8. The frequency divider apparatus of claim 1, wherein the frequency of the input signal is approximately equal to twice a natural frequency of a primary microbeam, and the primary microbeam is one of the plurality of microbeams and is configured to be parametrically driven by the input signal.

9. The frequency divider apparatus of claim 1, wherein the frequency of the input signal is approximately equal to a natural frequency of a primary microbeam, the primary microbeam is one of the plurality of microbeams and is configured to be directly driven by the input signal.

10. The frequency divider apparatus of claim 1 is formed as a micro-electro-mechanical system MEMS.

11. A frequency divider apparatus comprising a micro-electro-mechanical system (MEMS) divider configured to be driven by an input signal, the MEMS divider including a passive mechanical device, the passive mechanical device including a plurality of microbeams connected to each other, two adjacent microbeams from the plurality of microbeams being non-parallel to each other, the passive mechanical device generating multiple output signals in response to being driven by the input signal, and each of the output signals having a frequency less than a frequency of the input signal.

12. The frequency divider apparatus of claim 11, wherein the passive mechanical device is one continuous structure.

13. The frequency divider apparatus of claim 11, wherein:
the MEMS divider further includes a plurality of anchors; and
the plurality of microbeams are connected to the anchors.

14. The frequency divider apparatus of claim 11, wherein each of the plurality of microbeams is driven to generate one of the output signals.

15. The frequency divider apparatus of claim 11 further comprising a signal apparatus coupled to the MEMS divider, the signal apparatus generating the input signal for driving the MEM divider.

16. The frequency divider apparatus of claim 11 disposed in a portable communication device of a communication system.

17. A frequency divider apparatus comprising a micro-electro-mechanical system (MEMS) divider configured to be driven by a drive signal, the MEMS divider including a plurality of subsystem resonators, wherein the plurality of subsystem resonators are connected to each other to form a chain, two adjacent subsystem resonators from the plurality of subsystem resonators are non-parallel to each other, each of the plurality of subsystem resonators are parametrically driven, such that a given subsystem resonator generates an output signal.

18. The frequency divider apparatus of claim 17, wherein the plurality of subsystem resonators are connected in series, such that a first subsystem resonator from the plurality of subsystem resonators is driven by the drive signal, and a given subsystem resonator that is subsequent to the first subsystem resonator is driven by a former subsystem resonator that is connected and positioned prior to the given subsystem resonator.

19. The frequency divider apparatus of claim 17, wherein a frequency of the output signal generated by the given subsystem resonator from the plurality of subsystem resonators is approximately equal to a natural frequency of the given subsystem resonator.

20. The frequency divider apparatus of claim 17, wherein a frequency of the drive signal is approximately equal to twice a natural frequency of a primary subsystem resonator, and the primary subsystem resonator is one of the plurality of subsystem resonator and is configured to be driven by the drive signal.

21. The frequency divider apparatus of claim 17, wherein a frequency of the drive signal is approximately equal to a natural frequency of a primary subsystem resonator, and the primary subsystem resonator is one of the plurality of subsystem resonator and is configured to be directly driven by the drive signal.

22. The frequency divider apparatus of claim 17, wherein the MEMS divider is a single crystal silicon structure.

23. A frequency divider apparatus comprising a micro-electro-mechanical system (MEMS) divider configured to be driven by an input signal, the MEMS divider including:
a plurality of anchors; and
a passive mechanical device generating one or more output signals in response to the input signal and including a plurality of microbeams extending from the plurality of anchors, wherein two adjacent microbeams from the plurality of microbeams extend in different non-parallel directions from respective anchors, the plurality of microbeams are connected to each other, such that the plurality of microbeams form a chain in which the input signal is cascadingly transferred and divided by each of the microbeams.

24. The frequency divider apparatus of claim 23, wherein the passive mechanical device further includes a plurality of coupling members that connect two adjacent microbeams from the plurality of microbeams.

25. The frequency divider apparatus of claim 23, wherein the plurality of microbeams are orthogonally arranged to each other.

26. The frequency divider apparatus of claim 23, wherein the plurality of microbeams includes a first microbeam, a second microbeam, and a third microbeam, the first microbeam is connected to the second microbeam, and the second microbeam is connected to the third microbeam,
the first microbeam is driven by the input signal and generates a first output signal, and the first output signal has a frequency that is half a frequency of the input signal,
the second microbeam is driven by the first microbeam and generates a second output signal, and the second output signal has a frequency that is a fourth of the frequency of the input signal, and
the third microbeam is driven by the second microbeam and generates a third output signal, and the third output signal has a frequency that is an eighth of the frequency of the input signal.

27. A frequency divider apparatus comprising a micro-electro-mechanical system (MEMS) divider configured to be driven by an input signal, the MEMS divider including a passive mechanical device, the passive mechanical device including a plurality of microbeams, the plurality of microbeams being connected to each other, two adjacent microbeams from the plurality of microbeams being orthogonally arranged to each other, the passive mechanical device generating a plurality of modes in response to being driven by the input signal, and each of the modes having a frequency less than a frequency of the input signal.

28. The frequency divider apparatus of claim 27, wherein a given mode of the plurality of modes is localized in a given microbeam.

29. The frequency divider apparatus of claim 27, wherein the plurality of microbeams are connected in series, such that the frequency of the input signal is cascadingly divided by the modes of the passive mechanical device.

30. The frequency divider apparatus of claim 27, wherein the frequency of a given mode is approximately equal to half the frequency of a former mode.

31. A frequency divider apparatus for dividing a frequency of an input signal, the frequency divider apparatus comprising a mechanical divider configured to receive the input signal and including a plurality of microbeams cascadingly arranged, wherein each of the plurality of microbeams is parametrically driven and each of the plurality of microbeams generates an output signal that has a frequency less than a frequency of the input signal wherein the frequency of the input signal is approximately equal to a natural frequency of a primary microbeam, the primary microbeam is one of the plurality of microbeams and is configured to be directly driven by the input signal.

32. A frequency divider apparatus comprising a micro-electro-mechanical system (MEMS) divider configured to be driven by a drive signal, the MEMS divider including a plurality of subsystem resonators, wherein the plurality of subsystem resonators are connected to each other to form a chain, each of the plurality of subsystem resonators are parametrically driven, such that a given subsystem resonator generates an output signal, further wherein a frequency of the drive signal is approximately equal to a natural frequency of a primary subsystem resonator, and the primary subsystem resonator is one of the plurality of subsystem resonators and is configured to be directly driven by the drive signal.

* * * * *

UNITED STATES PATENT AND TRADEMARK OFFICE
CERTIFICATE OF CORRECTION

PATENT NO. : 9,716,485 B2
APPLICATION NO. : 14/732211
DATED : July 25, 2017
INVENTOR(S) : Steven Shaw et al.

It is certified that error appears in the above-identified patent and that said Letters Patent is hereby corrected as shown below:

In the Specification

Column 5, Line 43, delete "($\omega_{OA}$ $\omega_{OB}$)" and insert -- ($\omega_{OA}$ / $\omega_{OB}$) -- therefor Column 5, Lines 65-66, delete "($f_C$, $f_C$, $f_E$)" and insert -- ($f_C$, $f_D$, $f_E$) -- therefor Signed and Sealed this
Nineteenth Day of December, 2017

Joseph Matal
*Performing the Functions and Duties of the*
*Under Secretary of Commerce for Intellectual Property and*
*Director of the United States Patent and Trademark Office*